(12) United States Patent
Grenouillet et al.

(10) Patent No.: US 11,145,663 B2
(45) Date of Patent: Oct. 12, 2021

(54) METHOD FOR FABRICATING A FERROELECTRIC MEMORY AND METHOD FOR CO-FABRICATION OF A FERROELECTRIC MEMORY AND OF A RESISTIVE MEMORY

(71) Applicant: COMMISSARIAT À L'ÉNERGIE ATOMIQUE ET AUX ÉNERGIES ALTERNATIVES, Paris (FR)

(72) Inventors: Laurent Grenouillet, Grenoble (FR); Christelle Charpin-Nicolle, Grenoble (FR); Jean Coignus, Grenoble (FR); Terry Francois, Grenoble (FR); Sébastien Kerdiles, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 14 days.

(21) Appl. No.: 16/718,626

(22) Filed: Dec. 18, 2019

(65) Prior Publication Data

US 2020/0194442 A1 Jun. 18, 2020

(30) Foreign Application Priority Data

Dec. 18, 2018 (FR) ..................................... 1873162

(51) Int. Cl.
| | | |
|---|---|---|
| *H01L 27/11502* | (2017.01) | |
| *H01L 27/24* | (2006.01) | |
| *H01L 45/00* | (2006.01) | |

(52) U.S. Cl.
CPC ........ *H01L 27/11502* (2013.01); *H01L 27/24* (2013.01); *H01L 45/08* (2013.01); *H01L 45/146* (2013.01); *H01L 45/1683* (2013.01)

(58) Field of Classification Search
None
See application file for complete search history.

(56) References Cited

U.S. PATENT DOCUMENTS 8,872,268 B2 * 10/2014 Miller ................. H01L 45/1641
257/350
2016/0005749 A1 1/2016 Li et al.
(Continued)

FOREIGN PATENT DOCUMENTS

| CN | 103165172 B | 8/2015 |
|---|---|---|
| WO | WO 2010/035980 A2 | 4/2010 |

OTHER PUBLICATIONS

Xie, H., et. al., "Resistive Switching Properties of HfO2-based ReRAM with Implanted Si/Al Ions", AIP Conference Proceedings 1496:1, 26-29 (2012). (Year: 2012).*

(Continued)

*Primary Examiner* — J. E. Schoenholtz
(74) *Attorney, Agent, or Firm* — Pillsbury Winthrop Shaw Pittman LLP

(57) ABSTRACT

A method of fabrication of a ferroelectric memory including a first electrode, a second electrode and a layer of active material made of hafnium dioxide $HfO_2$ positioned between the first electrode and the second electrode, where the method includes depositing a first electrode layer; depositing the layer of active material; doping the layer of active material; depositing a second electrode layer; wherein the method includes sub-microsecond laser annealing of the layer of doped active material.

14 Claims, 7 Drawing Sheets

(56) References Cited

U.S. PATENT DOCUMENTS

| | | |
|---|---|---|
| 2018/0265967 A1 | 9/2018 | Lei et al. |
| 2018/0269057 A1 | 9/2018 | Lei et al. |
| 2018/0358471 A1 | 12/2018 | Yoo |
| 2020/0020542 A1* | 1/2020 | Lee ........................ H01L 21/324 |
| 2020/0020762 A1* | 1/2020 | Frank ................ H01L 21/02356 |
| 2020/0105344 A1* | 4/2020 | Tu ........................ H01L 27/2463 |

OTHER PUBLICATIONS

Search Report as issued in French Patent Application No. 1873162, dated Sep. 19, 2019.

* cited by examiner

[Fig. 1]
(101)
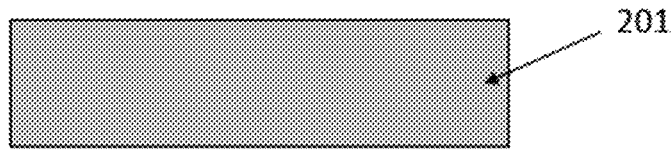
[Fig. 2]
(102)
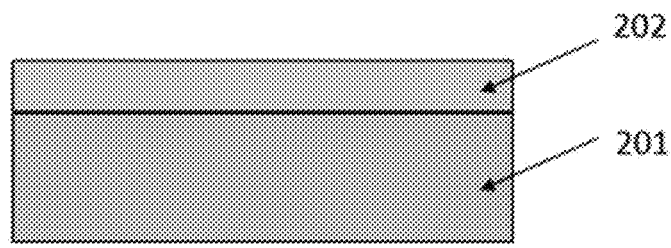
[Fig. 3]
(103)
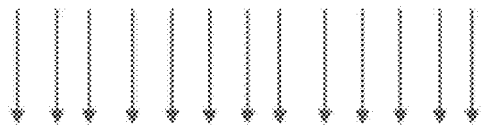
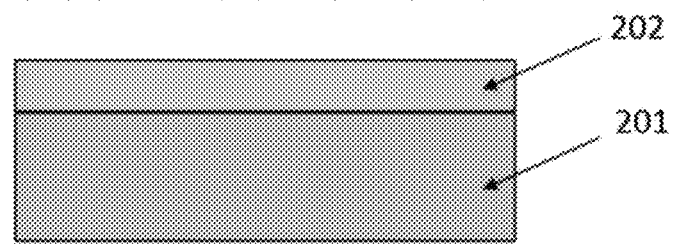
[Fig. 4]
(104)
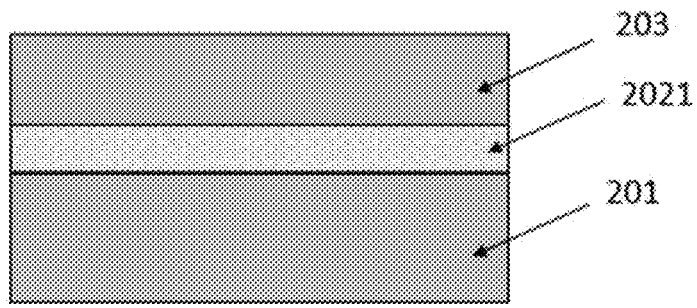

[Fig. 5]
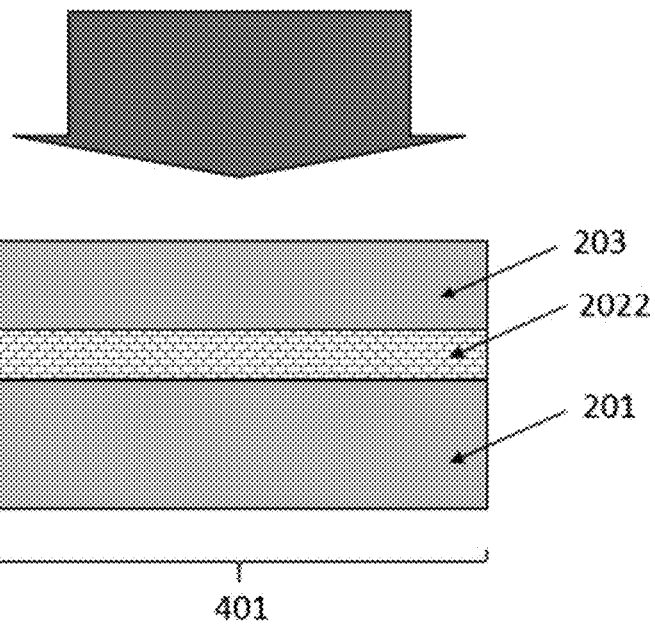
[Fig. 6]
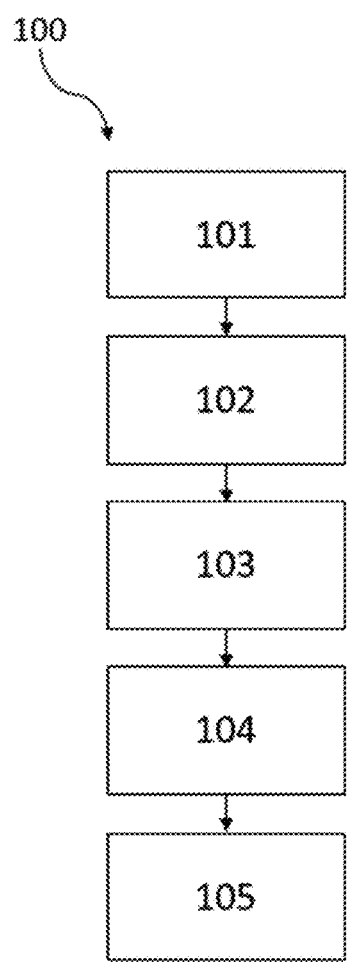

[Fig. 7]
(101)
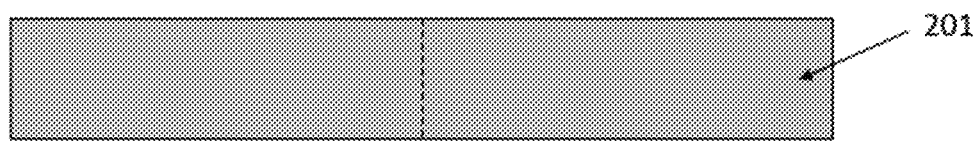
[Fig. 8]
(102)
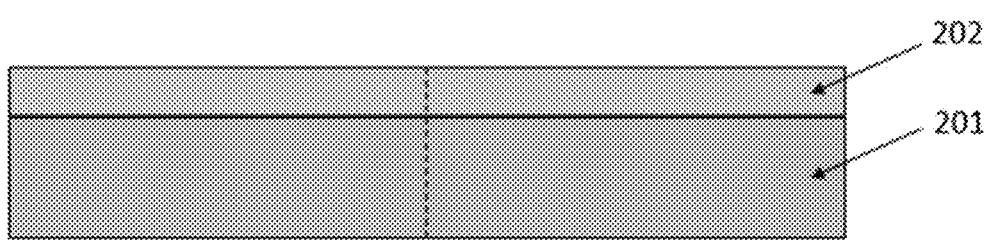
[Fig. 9]
(1021)
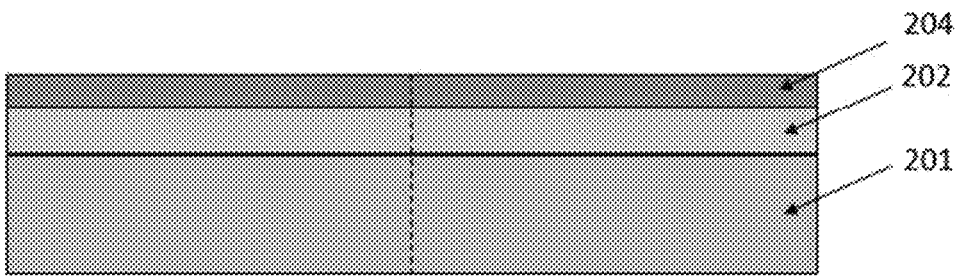
[Fig. 10]
(1022)
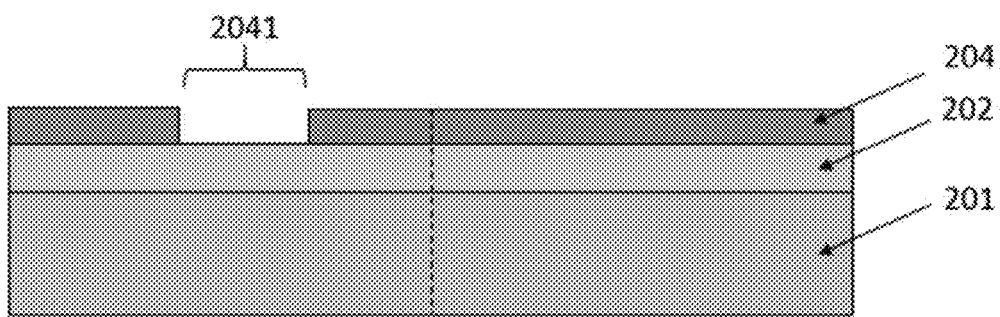

[Fig. 11]
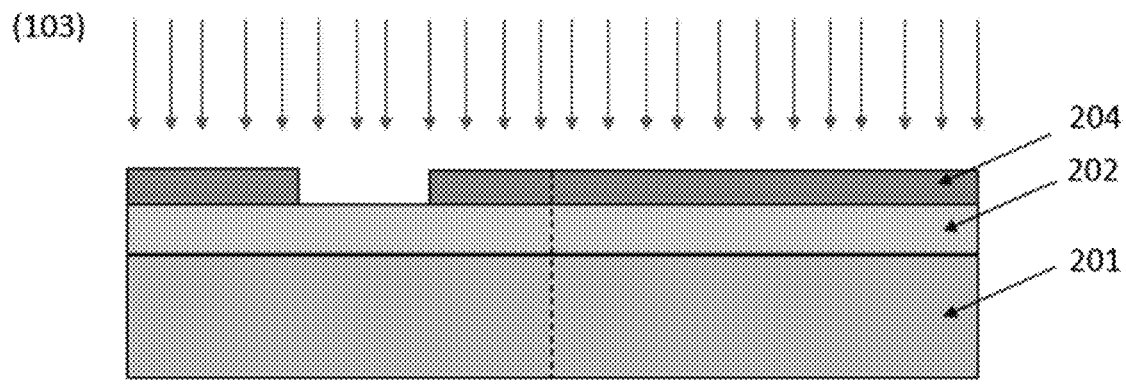
[Fig. 12]
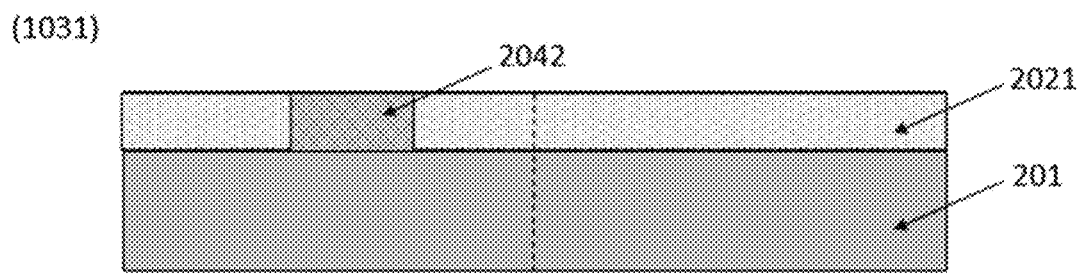
[Fig. 13]
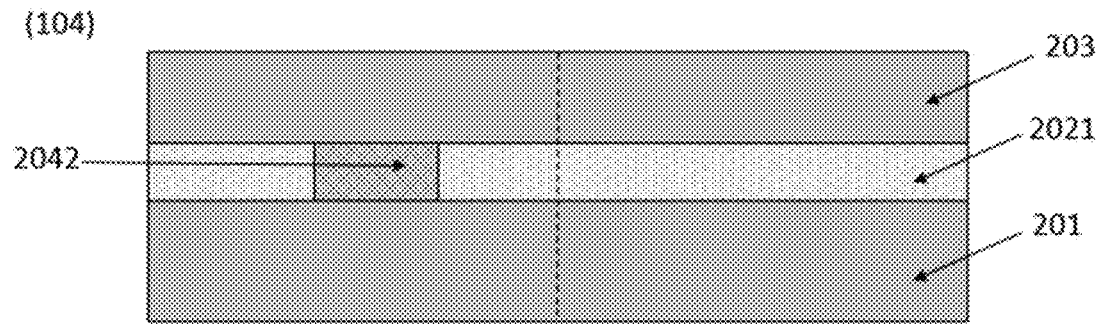

[Fig. 14]
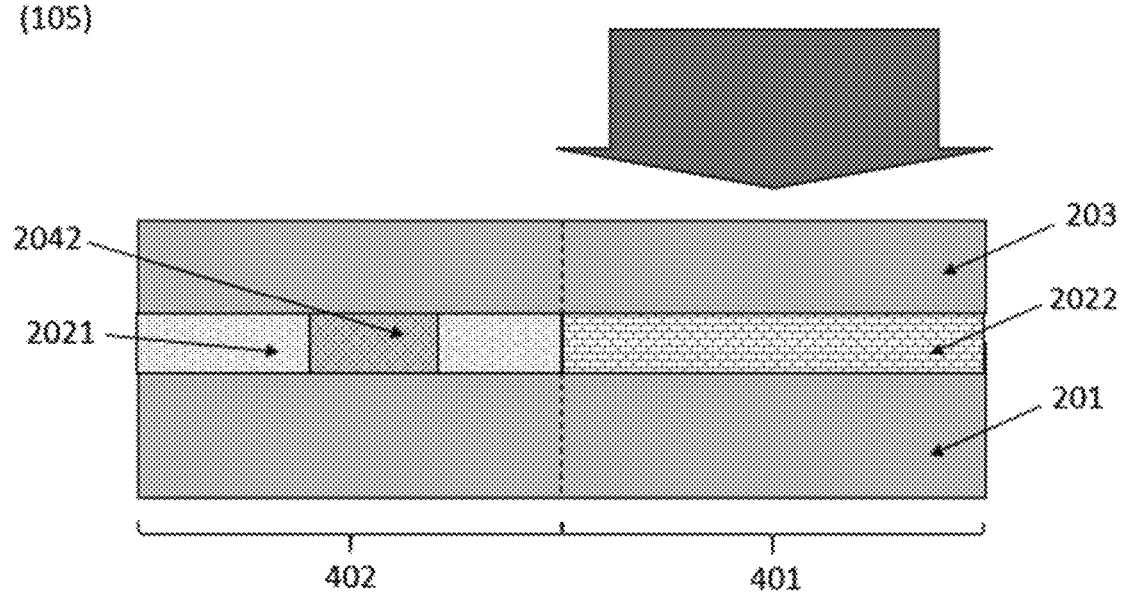
[Fig. 15]
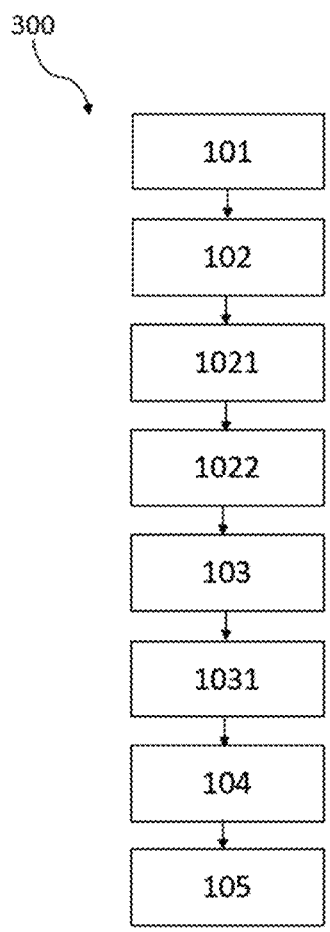

[Fig. 16]
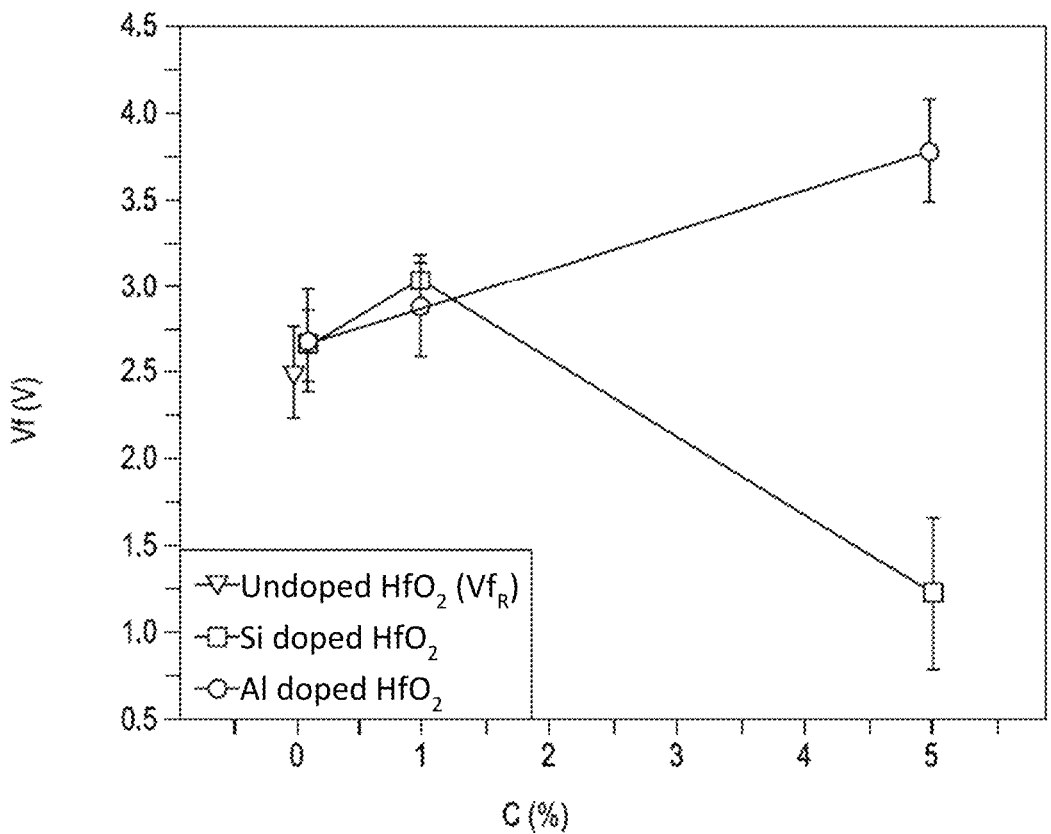
[Fig. 17]
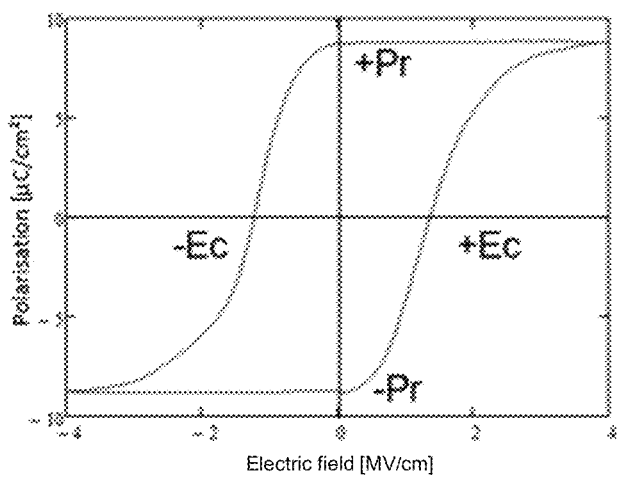

[Fig. 18]
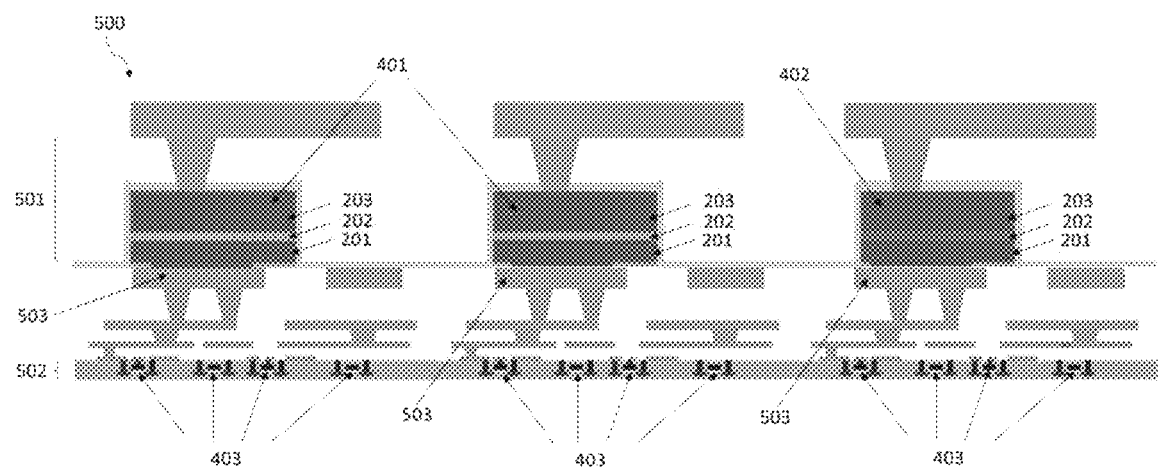

METHOD FOR FABRICATING A FERROELECTRIC MEMORY AND METHOD FOR CO-FABRICATION OF A FERROELECTRIC MEMORY AND OF A RESISTIVE MEMORY

CROSS REFERENCE TO RELATED APPLICATIONS

This application claims priority to French Patent Application No. 1873162, filed Dec. 18, 2018, the entire content of which is incorporated herein by reference in its entirety.

FIELD

The technical field of the invention is that of the fabrication of ferroelectric memories, and more specifically that of the fabrication of ferroelectric memories having a layer of active material made of hafnium dioxide and of the co-integration of such a ferroelectric memory with a resistive memory.

The present invention concerns a method for fabricating a ferroelectric memory, and in particular a method for fabricating a ferroelectric memory having a layer of active material made of hafnium dioxide. The present invention also concerns a method for co-fabrication of a ferroelectric memory and of a resistive memory having a layer of active material made of hafnium dioxide.

BACKGROUND

The main qualities of ferroelectric memories, or FeRAM memories, are that they are non-volatile, i.e. they retain the stored information even when the power is cut, they consume little energy, and they have short write and read times compared to other types of non-volatile memories such as FLASH memories.

Ferroelectric memories are memories of the capacitive type having two remanent polarization states, +Pr and −Pr.

FIG. 17 illustrates the operation of ferroelectric memories.

The operation of ferroelectric memories is based on the ferroelectric properties of their active material positioned between two electrodes. By applying a difference in potential between the two electrodes creating an electric field of a value higher than positive coercive field +Ec, the ferroelectric memory is put into a high remanent polarization state +Pr, and by applying a difference in potential creating an electric field of a value lower than negative coercive field −Ec the ferroelectric memory is put into a low remanent polarization state −Pr. High remanent polarization state +Pr then corresponds to binary logical state '0', and low remanent polarization state −Pr to binary logical state '1', which enables information to be stored.

The ferroelectric materials conventionally used in FeRAM memories, such as for example lead zirconate titanate PZT and strontium bismuth tantalate SBT, have the disadvantage that they are not compatible with CMOS technology, since they are prepared in dedicated clean rooms. Such ferroelectric memories cannot therefore be co-fabricated with other types of memories having an active layer compatible with the ferroelectric active memory, which limits their integration possibilities.

One possible alternative is then to use hafnium dioxide $HfO_2$. The disadvantage of this material is that it has ferroelectric properties only under certain constrictive doping and crystallization conditions. Indeed, the thermal budget required for crystallization is very high, since hafnium dioxide $HfO_2$ must be subjected to temperatures of between 600° C. and 1000° C. to crystalline in the appropriate phase. Such temperatures are, in particular, incompatible with back-end integration in a transistor, i.e. a successive integration in the fabricating steps of the transistor. Thus, a ferroelectric memory based on hafnium dioxide is not compatible with CMOS technology using back-end integration.

There is thus a need to fabricate a ferroelectric memory compatible with the CMOS technology using back-end and front-end integration, the fabricating steps of which do not require a high thermal budget.

SUMMARY

An aspect of the invention provides a solution to the problems mentioned above, by enabling a ferroelectric memory to be fabricated which can be co-integrated with a resistive memory without damaging the layers underlying the active material of the ferroelectric memory by overheating.

A first aspect of the invention concerns a method of fabrication of a ferroelectric memory comprising a first electrode, a second electrode and a layer of active material made of hafnium dioxide $HfO_2$ positioned between the first electrode and the second electrode, where the method comprises the following steps:
 a step of deposition of a first electrode layer;
 a step of deposition of the layer of active material;
 a step of doping of the layer of active material;
 a step of deposition of a second electrode layer;
 a step of sub-microsecond laser annealing of the layer of doped active material.

By virtue of the invention the sub-microsecond laser annealing enables the heating time of the doped active material to be reduced, which enables suitable crystallization of the hafnium dioxide in the form which gives it ferroelectric properties, without overheating the underlying layers. The sub-microsecond laser annealing also enables the heating to be concentrated in a precise zone. The method is also compatible with CMOS technology using back-end integration and front-end integration.

In addition to the characteristics mentioned in the previous paragraph, the method according to a first aspect of the invention can have one or more additional characteristics of the following kinds, considered individually or in all technically possible combinations.

Beneficially, the deposition of the first electrode and/or the deposition of the second electrode are of the PVD type.

Beneficially, the first electrode is made of titanium nitride TiN and the second electrode is made of titanium nitride TiN or titanium Ti.

Beneficially, the thickness of the first electrode is between 10 nm and 100 nm and the thickness of the second electrode is between 10 nm and 100 nm.

Beneficially, the deposition of the layer of active material is of the ALD type.

It is thus possible to deposit a thin layer of active material.

Beneficially, the thickness of the layer of active material is between 3 nm and 25 nm.

Beneficially, the step of doping is accomplished by ionic implantation or using a doping precursor.

Beneficially, the step of sub-microsecond laser annealing comprises between 1 and 1000 laser pulses, and, in an embodiment, between 10 and 100 laser pulses.

Beneficially, the duration of a laser pulse is between 20 and 500 ns, and, in an embodiment, between 100 and 200 ns.

Beneficially, the duration between two successive pulses is at least 100 µs.

The laser used is thus a pulsed laser, not a continuous laser, the pulses of which are of a duration typically less than 1 µs, and separated over time by at least 100 µs, which leaves the surface material time to cool between each pulse. There is no significant cumulative heating, which enables the underlying structures to be kept at a temperature of under 400° C. despite the temperature peaks on the surface in the active material of the ferroelectric memory during fabrication.

Beneficially, the wavelength of the laser is between 150 and 550 nm, and, in an embodiment, between 150 and 360 nm.

The laser is, in an embodiment, an ultraviolet laser which facilitates absorption in the extreme surface, and therefore a deposition of heat energy only in the very first nanometres.

Beneficially, the step of sub-microsecond laser annealing is accomplished after the step of deposition of the second electrode.

Beneficially, a method of co-fabrication of a ferroelectric memory and of a resistive memory comprising a first electrode, a second electrode and a layer of active material made of hafnium dioxide $HfO_2$ positioned between the first electrode and the second electrode comprises the steps of the fabricating method according to a first aspect of the invention and:
  a step of deposition of a first electrode layer of the resistive memory common to the step of deposition of the first electrode layer of the ferroelectric memory;
  a step of deposition of the layer of active material of the resistive memory common to the step of deposition of the layer of active material of the ferroelectric memory;
  a step of deposition of a mask on the layer of active material;
  a step of removal of at least one portion of the mask in the zone of the layer of active material intended to form the resistive memory by leaving the mask in the zone of the layer of active material intended to form the ferroelectric memory;
  the step of doping of the layer of active material accomplished by ionic implantation;
  a step of removal of the mask;
  a step of deposition of a second electrode layer common to the step of deposition of the second electrode layer of the ferroelectric memory;
  the step of sub-microsecond laser annealing of the layer of doped active material intended to form the ferroelectric memory.

The ferroelectric memory is thus co-integrated with a resistive memory.

Beneficially, the thickness of the mask is such that the mask allows only 10% of the doping elements to pass through during ionic implantation.

Thus, for a given ionic implantation the layer of active material receives ten times more doping elements without the mask than with the mask.

Beneficially, the mask is made of silicon nitride SiN, oxide or resin.

The mask can therefore easily be etched.

Beneficially, the step of removal of at least one portion of the mask of the resistive memory is accomplished, stopping at the layer of active material.

In the removed portion the doping is thus ten times greater.

Beneficially, the resistive memory is of the OxRAM or CBRAM type.

The active material of the ferroelectric memory is thus compatible with the active material of the resistive memory.

Beneficially, the doping element used for ionic implantation is silicon Si, aluminium Al, germanium Ge or gadolinium Gd.

Thus, when crystallized in the suitable form, hafnium dioxide doped with one of these doping elements has ferroelectric properties.

A second aspect of the invention concerns a device consisting of a stack comprising:
  an upper layer comprising at least one ferroelectric memory comprising a first electrode, a second electrode and a layer of active material made of hafnium dioxide $HfO_2$ positioned between the first electrode and the second electrode fabricated by the fabricating method or by the co-fabrication method according to a first aspect of the invention, and
  a lower layer comprising at least one MOS transistor,
wherein at least one MOS transistor is vertically covered by a ferroelectric memory.

Beneficially, the device according to the second aspect of the invention comprises at least one interconnection line between the lower layer and the upper layer.

Beneficially, the upper layer comprises at least one resistive memory, where the ferroelectric memory and the resistive memory are co-fabricated by the method of co-fabrication according to the first aspect of the invention.

The invention and its various applications will be better understood on reading the description which follows, and on examining the figures which accompany it.

BRIEF DESCRIPTION OF THE FIGURES

The figures are given for information only, and are not restrictive of the invention in any manner.

FIGS. 1 to 5 illustrate the different steps of the method for fabricating a ferroelectric memory according to a first aspect of the invention.

FIG. 6 shows the flow chart of the steps of the method according to a first aspect of the invention illustrated in FIGS. 1 to 5.

FIGS. 7 to 14 illustrate the different steps of the method for co-fabrication of a ferroelectric memory and of a resistive memory.

FIG. 15 shows the flow chart of the steps of the method of co-fabrication of a ferroelectric memory and of a resistive memory illustrated in FIGS. 7 to 14.

FIG. 16 shows the variation of the forming voltage of the switching area in a 10 nm thick layer of hafnium dioxide as a function of the atomic concentration, expressed as a percentage, of silicon or aluminium present in the hafnium dioxide layer.

FIG. 17 shows the variation of the polarization of a ferroelectric material as a function of the electric field.

FIG. 18 is a schematic representation of the device according to a second aspect of the invention.

DETAILED DESCRIPTION

Unless otherwise stipulated, a given element shown in different figures has a single reference.

A first aspect of the invention concerns a method 100 of fabrication of a ferroelectric memory 401.

The ferroelectric memory 401 fabricated in this manner comprises:
- a first electrode 201;
- a layer of active material 202 made of hafnium dioxide $HfO_2$; and
- a second electrode 203;

Hafnium dioxide $HfO_2$ has ferroelectric properties when it is doped with a particular doping element in order to obtain a suitable doping element concentration, and then crystallized in the orthorhombic phase.

FIGS. 1 to 5 illustrate the different steps 101 to 105 (flow chart of FIG. 6) of method 100 of fabrication of a ferroelectric memory 401.

FIG. 1 illustrates a first step 101 of method 100 according to a first aspect of the invention.

FIG. 2 illustrates a second step 102 of method 100 according to a first aspect of the invention.

FIG. 3 illustrates a third step 103 of method 100 according to a first aspect of the invention.

FIG. 4 illustrates a fourth step 104 of method 100 according to a first aspect of the invention.

FIG. 5 illustrates a fifth step 105 of method 100 according to a first aspect of the invention.

FIG. 6 shows the flow chart of the steps of the method according to a first aspect of the invention illustrated in FIGS. 1 to 5.

Step 101 of deposition of a first electrode layer 201 represented in FIG. 1 consists in accomplishing a conformal deposition of a layer of conductive material of first electrode 201.

The first electrode 201 is, for example, positioned on a substrate (not represented), where the first electrode 201 is designated as the lower electrode. The second electrode 203 is then designated as the upper electrode.

In the context of the invention the terms "lower" and "upper" are used to characterize the positions of the electrodes in the substrate's reference system.

The substrate is, for example, made of silicon Si and other layers may already have been formed on top of it.

The conductive material of first electrode 201 is, for example, titanium nitride TiN.

The deposition is, for example, a Physical Vapor Deposition, or PVD.

The thickness of the first electrode 201 is, for example, between 10 nm and 200 nm.

Step 102 of deposition of a layer of active material 202 represented in FIG. 2 consists in accomplishing a conformal deposition of hafnium dioxide $HfO_2$.

The deposition of the layer of active material 202 can be accomplished directly on the first electrode layer 201 or on another layer previously deposited on the first electrode layer 201.

The deposition is, for example, an Atomic Layer Deposition, or ALD, which enables thin layers to be deposited.

The thickness of the layer of active material 202 is, for example, between 5 and 25 nm. The thickness of the layer of active material 202 is, for example, approximately 10 nm (i.e. 10 nm+/−1 nm).

Step 103 is a step of doping of the layer of active material 202. The expression "doping of a layer" is understood to mean the action of introducing into the material of the layer atoms of another material called impurities.

According to one implementation represented in FIG. 3, doping step 103 is accomplished by ionic implantation. Doping by ionic implantation consists in accelerating impurities ionized with an electric field, to give them the necessary energy to enter into the material which is to be doped.

The doping element used is, for example, silicon Si, aluminium Al, germanium Ge or alternatively gadolinium Gd.

According to one unrepresented implementation, doping step 103 is accomplished using a doping precursor. For example, the doping precursor is used during ALD by alternating the cycles of deposition of hafnium dioxide $HfO_2$ and of doping elements and the number of cycles.

The doping precursor is, for example, silicon dioxide $SiO_2$.

After doping step 103 the layer of active material 202 has become a layer of doped active material 2021.

Step 104 of deposition of a second electrode layer 203 represented in FIG. 4 consists in accomplishing a conformal deposition of a layer of conductive material of second electrode 203.

The deposition of the second electrode layer 203 can be accomplished directly on the layer of doped active material 2021 or on another layer previously deposited on the layer of doped active material 2021.

The conductive material of the second electrode 203 is, for example, titanium nitride TiN or titanium Ti.

The deposition is, for example, a Physical Vapor Deposition, or PVD.

The thickness of the second electrode 203 is, for example, between 10 nm and 200 nm.

Step 105 of sub-microsecond laser annealing consists in heating the layer of doped active material 2021 for a duration which does not exceed several microseconds, for example 1 µs, to obtain a layer of active material which is doped and at least partially crystallized in the orthorhombic phase 2022, thus enabling the hafnium dioxide $HfO_2$ to have ferroelectric properties, whilst not damaging the underlying layers by overheating. Indeed, by virtue of this laser annealing of very short duration, the heat deposited at the surface of the ferroelectric memory during fabrication does not penetrate deeply into the ferroelectric memory. The heat remains confined to the first 100 to 500 nm, or 1 to 2 µm maximum.

Step 105 of sub-microsecond laser annealing can comprise a single laser pulse or a plurality of laser pulses. The number of laser pulses is, for example, between 1 and 1000 or between 1 and 150,000,000 laser pulses. The number of laser pulses is, for example, between 10 and 100 or between 1 and 1000 or between 1 and 100 laser pulses.

The duration of a laser pulse is chosen such that it heats only the layer of doped active material 2021. Indeed, depth p of the zone heated by the laser depends on heating duration t according to the following relationship:

$$p = \sqrt{\alpha * t} \qquad \text{[Math 1]}$$

With:

$$\alpha = \frac{k}{\rho * c_p} \qquad \text{[Math 2]}$$

Where k is the thermal conductivity of the heated material, $\rho$ is the density of the heated material and $c_p$ is the heat capacity of the heated material.

The duration of a laser pulse is, for example, between 20 and 500 ns and, in an embodiment, between 100 and 200 ns, which enables depths of 0.2 to 0.8 µm to be attained.

The duration between two successive pulses is, for example, approximately 100 µs (i.e. 100 µs+/−5 µs).

For example, the wavelength of the laser is between 150 and 550 nm, and, in an embodiment, between 150 and 360 nm. For example, the wavelength of the laser is 193 nm, 248 nm, 308 nm or 355 nm.

The density of energy deposited during a laser pulse is, for example, between 0.1 and 0.3 J/cm² or between 0.1 and 0.45 J/cm² in the case of a laser of wavelength 308 nm and of pulse duration of approximately 160 ns.

According to one implementation represented in FIG. 6, step 104 of deposition of the second electrode layer 203 is accomplished before step 105 of sub-microsecond laser annealing.

According to another unrepresented implementation, step 104 of deposition of the second electrode layer is accomplished after step 105 of sub-microsecond laser annealing. The second electrode layer 203 is then deposited directly on the layer of doped active material which is crystallized in the orthorhombic phase 2022 or on another layer previously deposited on the layer of doped active material which is crystallized in the orthorhombic phase 2022.

FIGS. 7 to 14 illustrate the different steps (flow chart of FIG. 15) of a method 300 of co-fabrication of a ferroelectric memory 401 and of a resistive memory 402 comprising steps 101 to 105 of method 100 of fabrication of a ferroelectric memory 401.

FIG. 7 illustrates first step 101 of method 300 of co-fabrication of a ferroelectric memory 401 and of a resistive memory 402.

FIG. 8 illustrates second step 102 of method 300 of co-fabrication of a ferroelectric memory 401 and of a resistive memory 402.

FIG. 9 illustrates third step 1021 of method 300 of co-fabrication of a ferroelectric memory 401 and of a resistive memory 402.

FIG. 10 illustrates fourth step 1022 of method 300 of co-fabrication of a ferroelectric memory 401 and of a resistive memory 402.

FIG. 11 illustrates fifth step 103 of method 300 of co-fabrication of a ferroelectric memory 401 and of a resistive memory 402.

FIG. 12 illustrates sixth step 131 of method 300 of co-fabrication of a ferroelectric memory 401 and of a resistive memory 402.

FIG. 13 illustrates seventh step 104 of method 300 of co-fabrication of a ferroelectric memory 401 and of a resistive memory 402.

FIG. 14 illustrates eighth step 105 of method 300 of co-fabrication of a ferroelectric memory 401 and of a resistive memory 402.

FIG. 15 shows the flow chart of the steps of method 300 of co-fabrication of a ferroelectric memory 401 and of a resistive memory 402 illustrated in FIGS. 7 to 14.

Co-fabrication method 300 enables the co-integration of a ferroelectric memory 401 and of a resistive memory 402 operating with a layer of active material made of hafnium dioxide $HfO_2$.

Resistive memory 402 fabricated in this manner comprises:
 a first electrode 201;
 a layer of active material 202 made of hafnium dioxide $HfO_2$; and
 a second electrode 203;

The layer of active material 202, and more generally the resistive memory 402, can toggle reversibly between two states of resistance.

During a write operation, a write voltage is applied to the resistive memory 402 to form a switching area in the layer of active material 202, between the first and second electrodes 201 and 203. The resistive memory 402 thus changes to a Low-Resistance State, also called LRS.

During an erasure operation, an erasure voltage is applied to the resistive memory 402 to break the switching area. The resistive memory 402 thus changes to a High-Resistance State, also called HRS.

When the resistive memory 402 is in its original state, just after fabrication, the switching area is formed for the first time by applying a forming voltage higher than the write voltage to the resistive memory 402. The resistive memory 402 then enters into a normal operational mode, in which the write voltage and the erasure voltage are used to toggle the resistance state of the resistive memory 402.

When the layer of active material of the resistive memory 402 comprises an over-doped zone, the switching area is formed for the first time in this over-doped zone and is always re-formed in this location during the subsequent write operations.

The resistance state of the resistive memory 402 can be determined at any time by applying a read voltage to it.

The resistive memory 402 is, for example, a memory of the OxRAM type, for "Oxide Resistive RAM", or a memory of the CBRAM type, for "Conductive Bridge RAM".

In the resistive memories of OxRAM type, the formation of the switching area is due to the accumulation of oxygen vacancies within the layer of active material 202.

In the resistive memories of the CBRAM type, the formation of the switching area is due to the formation of one or more metal filaments.

Step 101 of deposition of a first electrode layer 201 of the resistive memory 402 represented in FIG. 7 is common to step 101 of deposition of a first electrode layer 201 of the ferroelectric memory 401 represented in FIG. 1, i.e. a single layer of first electrode 201 is deposited, and a first zone of this single layer of first electrode 201 is intended to be the first electrode layer 201 of resistive memory 402 and a second zone of first electrode layer 201 is intended to be the first electrode layer 201 of ferroelectric memory 402.

Similarly, step 102 of deposition of the layer of active material 202 of the resistive memory 402 represented in FIG. 8 is common to step 102 of deposition of the layer of active material 202 of the ferroelectric memory 401 represented in FIG. 2, i.e. a single layer of active material 202 is deposited, and a first zone of this single layer of active material 202 is intended to be the layer of active material 202 of the resistive memory 402 and a second zone of the layer of active material 202 is intended to be the layer of active material 202 of the ferroelectric memory 401. The first zone of the layer of active material 202 is called in what follows the zone of the layer of active material 202 of the resistive memory 402, and the second zone of the layer of active material 202 is called in what follows the zone of the layer of active material 202 of the ferroelectric memory 401.

A step 1021 of deposition of a mask 204 represented in FIG. 9 consists in accomplishing a conformal deposition of mask 204 on the layer of active material 202, i.e. on the zone of the layer of active material 202 of the resistive memory 402 and on the zone of the layer of active material 202 of the ferroelectric memory 401. The portion of the mask deposited on the zone of the layer of active material 202 of the resistive memory 402 is called in what follows the mask of the resistive memory 402, and the portion of the mask deposited on the zone of the layer of active material 202 of the ferroelectric memory 401 is called in what follows the mask of the ferroelectric memory 401.

Mask 204 is, for example, made of silicon nitride SiN, titanium nitride TiN, oxide or resin.

According to an implementation represented in FIG. 10, a step 1022 of removal of at least a portion 2041 of mask 204 of the resistive memory 402 is accomplished, stopping at the layer of active material 202. Thus, after step 1022 of removal, at least a portion of the zone of the layer of active material 202 of the resistive memory 402 is exposed, i.e. directly accessible at the surface.

According to another unrepresented implementation, step 1022 of removal of at least a portion 2041 of mask 204 of the resistive memory 402 is accomplished without exposing layer of active material 202, i.e. leaving a lesser thickness of mask 204.

During this step 1022 of removal of at least a portion 2041 of mask 204 of the resistive memory 402, mask 204 of the ferroelectric memory 401 is left intact.

Step 1022 of removal of at least a portion 2041 of mask 204 of the resistive memory 402 is, for example, accomplished by lithography and etching.

Step 103, represented in FIG. 11, is a step of doping of the layer of active material 202 by ionic implantation, i.e. of doping of the zone of the layer of active material 202 of the resistive memory 402 and of the zone of the layer of active material 202 of the ferroelectric memory 401.

For example, the thickness of the mask 204 is chosen in order for the portions of the layer of active material 202 covered by the mask 204 to receive ten times fewer ions than the portions of the layer of active material 202 exposed during step 1022 of removal of at least a portion 2041 of the mask 204 of the resistive memory 402. The thickness of the mask 204 then depends on the material constituting the mask 204. For example, in the case of silicon nitrate SiN, the thickness is approximately 11 nm. For example, in the case of silicon dioxide $SiO_2$, the thickness is approximately 14 nm. For example, in the case of titanium nitrate TiN, the thickness is approximately 8 nm.

After step 103, the layer of active material 202 has become a layer of doped active material 2021 comprising over-doped zones 2042 corresponding to the portions of the zone of the layer of active material 202 of the resistive memory 402 exposed in step 1022 of removal of at least a portion 2041 of the mask 204 of the resistive memory 402.

Continuing with the previous example, the over-doped zones 2042 of the zone of the layer of active material 202 of the resistive memory 402 have ten times more doping than the remainder of the layer of doped active material 2021. For example, the over-doped zones 2042 are exposed to a dose of between $10^{15}$ ions/cm$^2$ and $5.10^{15}$ ions/cm$^2$, and the remainder of the layer of doped active material 2021 is exposed to a dose of between $10^{14}$ ions/cm$^2$ and $5.10^{14}$ ions/cm$^2$.

When the layer of active material 202 of the resistive memory 402 is doped with a suitable doping element, such as, for example, aluminium Al or silicon Si, the forming voltage of the switching area in the layer of active material 202 varies according to the atomic concentration of the doping element in the layer of active material 202.

Atomic concentration C of the doping element in a considered zone of the layer of active material 202 is expressed as a percentage, and is defined by the following relationship:

$$C = 100 * \frac{C_{dopant}}{C_{ma} + C_{dopant}} \quad \text{[Math 3]}$$

where $C_{dopant}$ is the concentration of atoms of the doping element present in the zone in question, and $C_{ma}$ is the concentration of atoms constituting the undoped layer of active material 202, where these concentrations $C_{dopant}$ and $C_{ma}$ being expressed as a number of atoms per cm$^{-3}$.

The forming voltage when the atomic concentration C of the doping element is zero, i.e. when the layer of active material 202 is not doped, is taken as the reference voltage.

For example, when the layer of active material 202 is doped with silicon Si, the forming voltage starts by increasing with the atomic concentration C of silicon Si, until it reaches a maximum value. Then, when the atomic concentration C of silicon Si continues to increase, the forming voltage reduces, going below the reference voltage.

For example, when the layer of active material 202 is doped with aluminium Al, the forming voltage increases in linear fashion with the atomic concentration C of aluminium Al.

These phenomena are illustrated in the curves of FIG. 16.

FIG. 16 represents the changes in the forming voltage $V_f$ measured in the hafnium dioxide $HfO_2$ as a function of the atomic concentration C of the doping element present in hafnium dioxide $HfO_2$.

In the case of silicon Si, the forming voltage $V_f$ is higher than the reference voltage $V_{fR}$ when the atomic concentration C of silicon Si is between 0.1% and 2%, and the maximum value of the forming voltage $V_f$ seems to be attained for the atomic concentration C of silicon Si of the order of 1%.

On the contrary, the forming voltage $V_f$ is lower than the reference voltage $V_{fR}$ when the atomic concentration C of silicon Si is higher than 2%.

Conversely, in the case of aluminium, the forming voltage $V_f$ is always higher than the reference voltage $V_{fR}$, regardless of the atomic concentration C of aluminium Al.

After step 103, the zone of the layer of active material 202 of the resistive memory 402 comprises at least one over-doped zone 2042 in which the atomic concentration C of doping element is chosen so as to locate the switching area in an over-doped zone 2042.

In other words, this amounts to ensuring that an over-doped zone 2042 has a forming voltage lower than the forming voltage in the remainder of the layer of active material 202, which is less doped.

Thus, by applying to the resistive memory 402 a forming voltage between the forming voltage in the remainder of the layer of active material 202 and the forming voltage of the over-doped zone 2042, the switching area can be formed in an over-doped zone 2042.

The method 300 of co-fabrication therefore enables the location of the switching area of the resistive memory 402 to be controlled depending on the doping of the layer of active material 202, which enables the variability between the resistive memories 402 to be reduced.

Step 1031, represented in FIG. 12, is a step of removal of the mask 204, i.e. of the mask of the ferroelectric memory 401 and of the remaining mask portions of the resistive memory 4012.

Step 1031 is, for example, accomplished by a method of dry etching (oxygen plasma in the case of a resin mask, fluorocarbon plasma in the case of a silicon oxide or silicon nitride mask), or a method of wet etching (diluted ortho-phosphoric acid in the case of a silicon nitride mask, or diluted hydrochloric acid in the case of a silicon oxide or silicon nitride mask), since these methods are selective in relation to the active material.

Step 104 of deposition of the second electrode layer 203 of the resistive memory 402 represented in FIG. 12 is common to step 104 of deposition of the second electrode layer 203 of the ferroelectric memory 401 represented in FIG. 4, i.e. a single layer of the second electrode 203 is deposited, and a first zone of this single layer of the second electrode 203 is intended to form the second electrode layer 203 of the resistive memory 402 and a second zone of the second electrode layer 203 is intended to form the second electrode layer 203 of the ferroelectric memory 401.

Step 105 of sub-microsecond laser annealing consists in heating only the zone of the layer of doped active material 2021 of the ferroelectric memory 501 to obtain a layer of doped active material which is crystallized in the orthorhombic phase 2022 only in the zone of the layer of active material intended to form the ferroelectric memory 501.

After step 105 of sub-microsecond laser annealing of the method of co-fabrication 300, the zone of the layer of active material 2022 of the ferroelectric memory 501 is doped and crystallized in the orthorhombic phase and the zone of the layer of active material 2021 of the resistive memory 502 is doped and has at least one over-doped zone 2042 in which the switching area will be formed.

According to one implementation represented in FIG. 15, step 104 of deposition of the second electrode layer 203 is accomplished before step 105 of sub-microsecond laser annealing.

According to one unrepresented implementation, step 104 of deposition of the second electrode layer 203 is accomplished after step 105 of sub-microsecond laser annealing.

A second aspect of the invention concerns a device consisting of a stack comprising an upper layer and a lower layer.

FIG. 18 shows a schematic representation of device 500 according to a second aspect of the invention.

The upper layer 501 comprises at least one ferroelectric memory 401 fabricated by method 100, 300, i.e. a ferroelectric memory 401 comprising a first electrode 201, a second electrode 203 and a layer of active material 202 made of hafnium dioxide $HfO_2$ positioned between the first electrode 201 and the second electrode 203.

As illustrated in FIG. 18, the upper layer 501 can also comprise a resistive memory 402. In this case, the ferroelectric memory 401 and the resistive memory 502 are co-fabricated using method 300.

The lower layer 502 comprises at least one MOS transistor 403. According to one example implementation, the MOS transistor is a CMOS transistor, compatible with CMOS technology.

The upper layer 501 and the lower layer 502 are positioned such that at least one MOS transistor 403 is vertically covered by one ferroelectric memory 401.

The phrase "a first element is vertically covered by a second element" is understood to mean that the second element is located above the first element along a vertical axis perpendicular to the first element, which passes through the first element. According to this definition, it is possible that the first element may not be in physical contact with the second element.

The lower layer 502, and in particular one MOS transistor 403, is, for example, in electrical contact with the upper layer 501, and in particular with one ferroelectric memory 401, via at least one metal interconnection line 503, also called a metal via.

One electrode of a MOS transistor 403, for example the drain, can be in physical contact with the first electrode 201 of one ferroelectric memory 401.

The MOS transistor or all the MOS transistors of the lower layer 502 are fabricated in the front-end-of-the-line phase, with high thermal budgets which can go as high as 1100° C., while the upper layer 501 comprising the ferroelectric memory 401 is integrated in the back-end-of-the-line phase, with a thermal budget (excluding laser annealing) limited to 400° C. The use of the sub-microsecond laser prevents any negative impact on the electrical properties of the MOS transistors and on the levels of metal interconnections 503 when such exist. In addition, use of a sub-microsecond laser enables the properties of ferroelectric layer 202 to be improved by allowing crystallization in a phase compatible with ferroelectric properties.

The device 500 has a structure called 1T/1R, commonly used to reduce leakage currents within an architecture of the cross-bar type, integrating resistive memories at high densities.

The invention claimed is:

1. A method of co-fabrication of a ferroelectric memory and of a resistive memory, the method of co-fabrication comprising:
    depositing a first electrode layer comprising a first zone intended to form a first electrode of the resistive memory and a second zone intended to form a first electrode of the ferroelectric memory, the ferroelectric memory including the first electrode, a second electrode and a layer of active material made of hafnium dioxide $HfO_2$ positioned between the first electrode and the second electrode of the ferroelectric memory, and the resistive memory including the first electrode, a second electrode and a layer of active material made of hafnium dioxide $HfO_2$ positioned between the first electrode and the second electrode of the resistive memory;
    depositing a layer of active material comprising a first zone intended to form the layer of active material of the resistive memory and a second zone intended to form the layer of active material of the ferroelectric memory;
    depositing a mask on the layer of active material;
    removing at least a portion of the mask in the first zone of the layer of active material, leaving the mask in the second zone of the layer of active material;
    doping the layer of active material accomplished by ionic implantation;
    removing the mask;
    depositing a second electrode layer comprising a first zone intended to form the second electrode of the resistive memory and a second zone intended to form the second electrode of the ferroelectric memory;
    sub-microsecond laser annealing of the second zone of the layer of doped active material.

2. The method according to claim 1, wherein a thickness of the mask is such that the mask allows only 10% of the doping elements to pass through during ionic implantation.

3. The method according to claim 1, wherein the removing of at least a portion of the mask of the resistive memory is accomplished stopping at the layer of active material.

4. The method according to claim 1, wherein the resistive memory is an OxRAM or CBRAM memory.

5. The method according to claim 1, wherein the doping element used for ionic implantation is silicon Si, aluminium Al, germanium Ge or gadolinium Gd.

6. A device constituting of a stack comprising:
    an upper layer comprising at least one ferroelectric memory comprising a first electrode, a second electrode and a layer of active material made of hafnium dioxide $HfO_2$ positioned between the first electrode and the second electrode, the upper layer comprising at least one resistive memory, wherein the ferroelectric memory and the resistive memory are co-fabricated by a method of co-fabrication, and a lower layer comprising at least one MOS transistor, wherein at least one MOS transistor vertically covered by one ferroelectric memory.

7. The device according to claim 6, further comprising at least one interconnection line between the lower layer and the upper layer.

8. The method according to claim 1, wherein the sub-microsecond laser annealing comprises between 1 and 1000 laser pulses.

9. The method according to claim 8, wherein the sub-microsecond laser annealing comprises between 10 and 100 pulses.

10. The method according to claim 8, wherein a duration of a laser pulse is between 20 and 500 ns.

11. The method according to claim 10, wherein the duration of a laser pulse is between 100 and 200 ns.

12. The method according to claim 1, whereon a wavelength of the laser is between 150 and 550 nm.

13. The method according to claim 12, wherein the wavelength of the laser is between 150 and 360 nm.

14. The method according to claim 1, wherein the doping is accomplished by ionic implantation or using a doping precursor.

\* \* \* \* \*